United States Patent [19]

Arvidsson

[11] Patent Number: 5,510,737
[45] Date of Patent: Apr. 23, 1996

[54] METHOD AND APPARATUS FOR SAMPLING OF ELECTRICAL SIGNALS

[75] Inventor: Erik R. Arvidsson, Västra Frölunda, Sweden

[73] Assignee: Telefonaktiebolaget LM Ericsson, Stockholm, Sweden

[21] Appl. No.: 289,539

[22] Filed: Aug. 12, 1994

[30] Foreign Application Priority Data

Aug. 13, 1993 [SE] Sweden .................................. 9302627

[51] Int. Cl.⁶ ........................................... G11C 27/02
[52] U.S. Cl. .............................. 327/91; 327/337; 327/554
[58] Field of Search ................................ 327/91, 94, 62, 327/337, 554, 33

[56] References Cited

U.S. PATENT DOCUMENTS

| 4,322,697 | 3/1982 | Carbrey | 327/554 |
| 4,878,029 | 10/1989 | Saulnier et al. | 329/341 |
| 4,954,785 | 9/1990 | Segaram | 327/554 |
| 5,021,749 | 6/1991 | Kasai et al. | 327/554 |
| 5,109,169 | 4/1992 | Hughes | 327/91 |
| 5,341,037 | 8/1994 | Miki et al. | 327/91 |
| 5,387,874 | 2/1995 | Rapeli | 327/91 |

FOREIGN PATENT DOCUMENTS

| 0109121 | 5/1984 | European Pat. Off. . |
| 0458452 | 11/1991 | European Pat. Off. . |
| 0458452 | 11/1991 | European Pat. Off. . |
| 2341784 | 2/1974 | Germany . |
| 2176362 | 12/1986 | United Kingdom . |

Primary Examiner—John S. Heyman
Assistant Examiner—My-Trang Nu Ton
Attorney, Agent, or Firm—Burns, Doane, Swecker & Mathis

[57] ABSTRACT

Method and apparatus for sampling an electrical signal in order to obtain at least one signal weighted together from two or more samples, in which in a first step the electrical signal is connected to a number of capacitors connected in parallel. In a second step, one capacitor is disconnected from the electrical signal at each time of sampling and in a third step, when the sampling is completed, the capacitors are connected together. In this manner, one or more signals weighted together are generated in dependence of the charge of the capacitors when they are disconnected from the electrical signal and of the capacitances of the capacitors.

16 Claims, 1 Drawing Sheet

METHOD AND APPARATUS FOR SAMPLING OF ELECTRICAL SIGNALS

BACKGROUND

The present invention relates to a method and an apparatus for sampling electrical signals.

In fields such as radar engineering and telecommunication, information exists in the form of carrier frequency signals. In order to extract the information the signal must be demodulated, which is most often achieved by down-mixing to the frequency 0, so-called baseband or "zero-IF" systems. Often the down-mixing is performed in two steps, first from high frequency to an intermediate frequency and thereafter to the baseband.

In the above systems, the information exists both in the amplitude of the signal and in its phase. A simple envelope detection is therefore not sufficient. For this reason the last down-mixing is performed in two mixers in which one of them is supplied with the intermediate frequency signal and a reference signal and the second with the intermediate frequency signal and the reference signal phase-shifted 90°. The frequency of the reference signal is then equal to the centre frequency of the intermediate frequency.

The result is two orthogonal signals which can be regarded as a complex representation of the baseband signal in which both amplitude and phase information are preserved. As a rule, these signals are called I- (In-phase) and Q(Quadrature) signals.

As modern signal processing almost exclusively uses digital technology, the I- and Q-signals are converted into digital form in an analogue/digital converter, after which the signal processing, for example filtering, is performed.

In many applications, and especially in radar applications, the requirements for amplitude equality and phase orthogonality between the I- and Q-signals are very high. This implies that some kind of automatic, active calibration procedure usually is used. The calibration procedure consumes signal processing capacity and also requires certain additional equipment. It is therefore desirable to eliminate the need for calibration.

One method of eliminating the calibration need is to perform the analogue/digital conversion directly on the inter-mediate frequency signal and thereafter split up the obtained signal samples into one I- and one Q-value by means of digital filters. Examples of apparatus which utilize this method are described in the patent documents EP-109121 and UK2176362.

Even this method has drawbacks. The use of the method is thus limited due to limitations in the conversion rate of the analogue/digital converters in combination with accuracy. The requirements as regards rate for the logics in the digital filters are also high. The rate requirements lead to an increased power requirement.

The object of the now present invention is therefore to eliminate the need for filtering in order to provide quadrature signals from an amplitude modulated carrier signal and to reduce the requirements on the analogue/digital conversion rate at the same time as high requirements are met regarding accuracy in the I- and Q-channels and very low power consumption.

SUMMARY

Said object is achieved by a method for sampling of an electrical signal according to the present invention, in which the signal is connected to a number of parallel connected capacitors; one capacitor is disconnected from the signal at each sampling time; and when sampling is completed, the capacitors are again connected together.

Said object is also achieved by an apparatus for sampling of an electrical signal according to the present invention, in which a switch device initially connects a plurality of capacitors in parallel to the electrical signal; the switch device disconnects one capacitor from the signal at each sampling time; and the switch device finally connects the disconnected capacitors together.

DESCRIPTION OF A PREFERRED EMBODIMENT

By way of introduction, the theoretical background of the invention will be described in connection with FIG. 1.

Figure 1:
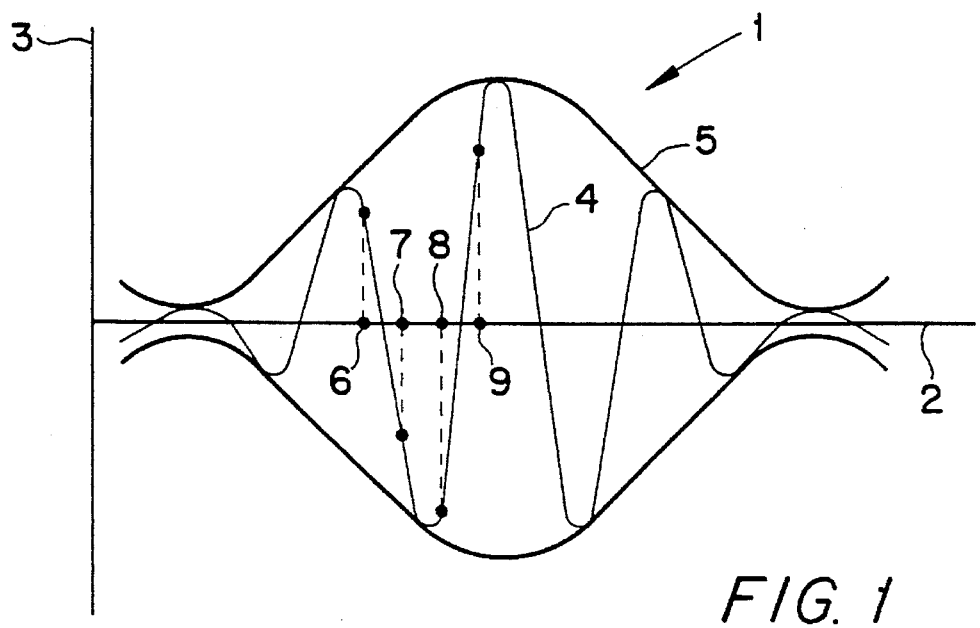
FIG. 1 shows in a time diagram an amplitude modulated carrier.

The diagram in FIG. 1 shows an amplitude-time diagram 1 with a time axis 2, a signal amplitude axis 3 and an amplitude modulated carrier signal 4, the envelope of which is denoted by 5. The carrier signal 4 is assumed to be sampled at four points in time, at which the first time of sampling is denoted by the reference number 6 and the second up to and including the fourth time of sampling are denoted by 7, 8, 9 respectively. At the times of sampling, the amplitude of the carrier signal is $a6, a7, a8, a9$ respectively. The interval between the times of sampling is here assumed to be ¼ of the period of the carrier signal.;

As ¼ of the period corresponds to 90°, the amplitude values $a6$ and $a7$ may be regarded as, for example, an I/Q pair in which $I=a6$ and $Q=a7$. However, this simple method leads to great errors. The I/Q values are indeed orthogonal but they relate to different points in time (6 and 7 respectively) and represent therefore different amplitudes of the envelope.

By known methods it is however possible to calculate filter functions which calculate I/Q-pairs related to the same time of sampling by means of several samples. The methods utilize the fact that the filtered signals can be described mathematically by means of series developments in which the terms of the series consist of weighted values of the samples. When calculating the weighting coefficients, the present accuracy requirements determine how many terms, and thereby samples, that shall be included.

With the earlier mentioned four samples, the following expression for I and Q may be derived:

$I=(a6-3 \cdot a8)/4$ . . . (A)
$Q=(-3 \cdot a7+a9)/4$ . . . (S)

This I/Q pair gives a correct interpolation of a linearly or quadratically varying signal which represents the amplitude at a point in time 7.5 i.e. halfway between the points in time 7 and 8, for both I and Q with a maintained orthogonality.

In order to consider terms of a higher degree in the series development that represents the envelope of the input signal, more samples can be taken. If an additional two samples with the amplitudes $a10$ and $a11$ are taken, the following expression can be derived:

$I=(a6-10 \cdot a8+5 \cdot a10)/16$ . . . (C)
$Q=(5 \cdot a7-10 \cdot a9+a11)/16$ . . . (D)

which also gives a correct value for a cubically varying signal. The expressions represent an I/Q pair which relates to a time of sampling halfway between the samples a8 and a9. It can here be noted that the employed method of calculation results in coefficients in the I/Q filters that are mirror symmetrical between I and Q.

The present invention provides a method and an apparatus by which I- and Q-signals according to the expression mentioned above are directly obtained from the sampling without the need to perform digital filtering. The method may be described in the following way:

In an initial stage, a number of capacitors connected in parallel is connected to the input signal. During the interval when the sampling is made, one capacitor is disconnected from the input signal at each time of sampling. Each such disconnected capacitor will therefore contain a charge which represents the value (amplitude) of the input signal at the time of sampling.

When the sampling is completed, the disconnected capacitors are connected in parallel and their charges are redistributed between them in dependence of the capacitance of the respective capacitor. As will become more evident in connection with the following description of an embodiment, the relation between the capacitance of the capacitors can be chosen so that the resulting voltage across the capacitors connected in parallel corresponds to the expressions for I or Q shown above. In the cases when negative coefficients are part of the expressions, the capacitor which contains the corresponding sample is connected in parallel with reversed polarity.

The method implies that a very good phase orthogonality between I and Q is achieved because the relative time positions for the times of sampling can be maintained with high accuracy, in the order of 10 pico seconds. At a carrier frequency of 30 MHz, this corresponds to a phase error <0.1°, a value which is impossible to achieve by earlier known, analogue methods without active calibration.

Figure 2:
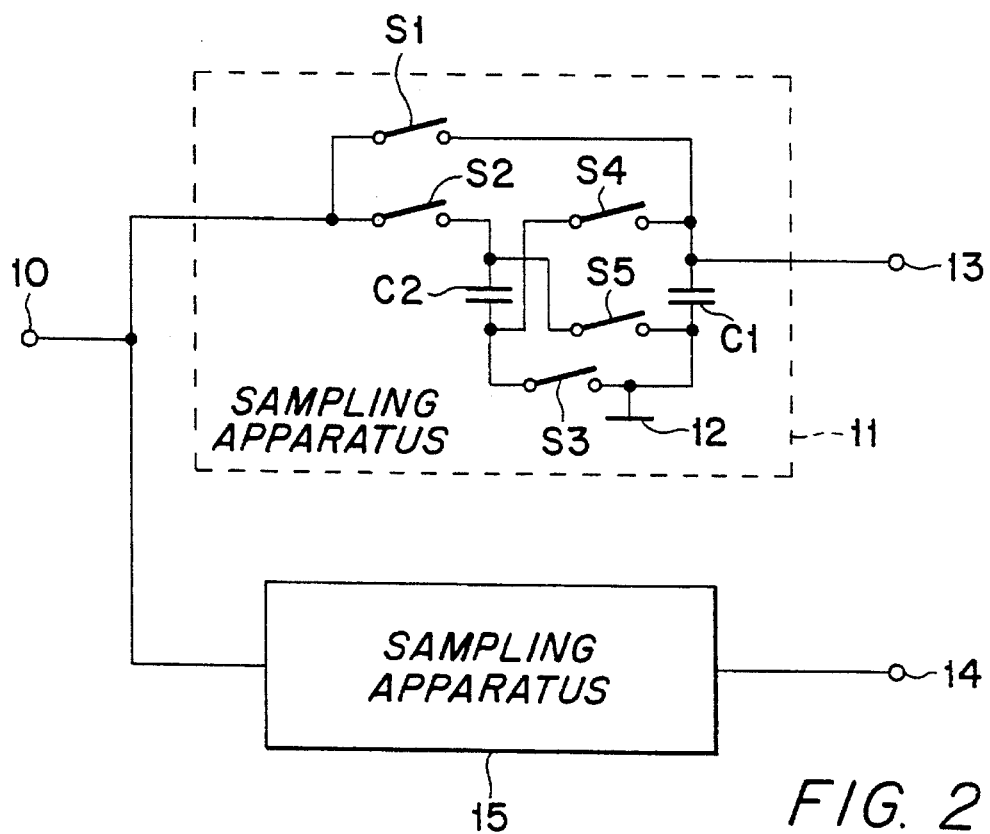
FIG. 2 shows one embodiment of a sampling apparatus according to the invention.

An apparatus which performs the sampling and interpolation described above is shown in FIG. 2. The amplitude modulated carrier signal 4 is connected to terminal 10 and thus supplied to two identical sampling apparatus 11 and 15. In the sampling apparatus 11 (and 15) the signal 4 is, on the one hand, connected via a switch S1 to a first side of a capacitor C1 and, on the other hand, via a switch S2 to a first side of a capacitor C2. The other side of the capacitor C1 is, on the one hand, directly connected to a "grounding terminal" 12, and, on the other hand, via a switch S5 to the first side of the capacitor c2. The other side of the capacitor C2 is connected via a switch S3 to the grounding terminal 12 and, via a switch S4, to the first side of the capacitor C1. The first side of the capacitor C1 is also connected to an output terminal 13.

The sampling apparatus 15 is identical to the sampling apparatus 11 and is connected to an output terminal 14.

The function of the sampling apparatus 11 is the following:

In the opening stage, the switches S1, S2 and S3 are closed while S4 and S5 are opened. This means that the capacitors C1 and C2 are connected in parallel to the terminal 10. At the first time of sampling 6, the switch S1 is opened, upon which the capacitor C1 is disconnected from the terminal 10, charged to the voltage a6. At the third time of sampling 8, the switch S2 is opened, upon which the capacitor C2 is also disconnected, charged to the voltage a8.

Immediately thereafter, the switch S3 is opened, after which the switches S4 and S5 are closed. This means that the first side of capacitor C2 is connected to the second side of capacitor C1, and the second side of C2 to the first side of C1, i.e. the capacitor C2 is connected with reversed polarity in parallel with the capacitor C1. The charges of the capacitors are thereby redistributed so that a voltage I is formed across the capacitors connected in parallel, as well as on the output terminal 13.

If the capacitance values of the capacitors C1 and C2 are denoted c1 and c2 respectively, I will become $=(c1 \cdot a6 - c2 \cdot a8)/(c1+c2)$. If the capacitance values are chosen so that $c2=3 \cdot c1$ I will become $=(a6-3 \cdot a8)/4$, which agrees with the earlier mentioned expression (A) for the I-signal.

If the switches of the sampling apparatus 15 are controlled in a corresponding way so that the switch S2 is opened at the second time of sampling 7, and at the fourth time of sampling the switch S1 is opened, a voltage $Q = (c2 \cdot a7 + c1 \cdot a9)/(c1+c2)$ is formed on the output terminal 14 once the switch S3 is opened and the switches S4 and S5 are closed. With the capacitance ratio $c2=3 \cdot c1$ Q will thus become $=(-3 \cdot a7+a9)/4$, which agrees with the earlier mentioned expression (B) for the Q-signal.

In a similar way an apparatus, which as a result provides voltages which correspond to the above mentioned expressions (C) and (D), can be designed. The sampling apparatus (11) must then comprise an additional capacitor C3 with the capacitance c3 and with an associated switch. c2 is in this case chosen to be $10 \cdot c1$ and c3 to be $5 \cdot c1$, which corresponds to the coefficients of the expression (C). When connected in parallel after the sampling, C2 should be connected in parallel with reversed polarity because the corresponding coefficient in the expressions have a negative sign.

By completing the sampling apparatus 15 in a corresponding manner with a capacitor C3 and with an associated switch, a voltage which corresponds to the expression (D) can be obtained.

The I- and Q-signals generated in this way can thereafter be converted to digital form. This can be achieved by means of separate analogue/digital converters for each I- and Q-signals or by a common converter which first converts one of the signals and thereafter is switched to the other signal in order to convert it.

In the second alternative, which from the power consumption point of view is the most favourable, the sampling apparatus must be able to keep the value which is to be converted last unchanged during the time needed for conversion of the first one.

The sampling apparatus can also be designed such that the capacitors, the related sample of which is included with a positive sign in an expression for I or Q, are connected in parallel for themselves and the capacitors, the related sample of which is included with a positive sign in the expression, are connected in parallel for themselves. In that way two voltages are generated which each separately can be analogue/digital converted after which the voltage corresponding to the complete expression for I or Q can be generated by joining together the digital values of the voltages. At the joining together, the value which originates from the capacitors the corresponding sample of which is included with a negative sign, is to be subtracted.

When the conversion is completed, the sampling apparatus is returned to its opening stage and thereafter is ready to take new samples.

The switches are controlled by a not shown time control logic. This time control logic can be arranged in different ways and will not cause a person skilled in the art any direct design problems. It will therefore not be described in detail in this connection.

When constructing the sampling apparatus, the sampling circuits and possible switches for a common analogue/ digital converter are advantageously built together with the required time control logic in one and the same integrated circuit, for which it is suitable to use CMOS-technology.

By means of the apparatus herein described, the number of circuit elements needed for the sampling has been minimized at the same time that the conversion rate for the analogue/digital converter is reduced. This means, among other things, that a higher conversion accuracy can be achieved. The invention also implies that the need for digital filters to obtain a digital quadrature signal from an amplitude modulated carrier signal is eliminated. Space as well as power requirements are therefore considerably reduced compared to earlier known apparatus, at the same time that high accuracy in the I- and Q-channels is achieved.

The thus described embodiment has addressed the application of the invented method for an apparatus for obtaining an I/Q pair. The method and the apparatus are however also applicable in other connections when it is desired to weigh a number of samples together and to relate them to one and the same time of sampling.

The invention is not limited to the above described embodiments, but can be varied within the scope of the appended claims.

What is claimed is:

1. A method of sampling an electrical signal and generating a combined signal from at least two samples of the electrical signal, comprising the steps of:

connecting the electrical signal to a plurality of capacitors connected in parallel;

at each of a plurality of sampling times, disconnecting a capacitor from the electrical signal, thereby generating the samples of the electrical signal; and when sampling is completed, reconnecting the disconnected capacitors together, thereby generating the combined signal from the samples, the samples being weighted in dependence on the charges on the capacitors when they were disconnected from the electrical signal and on the capacitances of the capacitors.

2. The method of claim 1, wherein the capacitances of the capacitors are related to each other as weight coefficients for the samples of the electrical signal.

3. The method of claim 2, wherein at each sampling time, the capacitor having the capacitance which corresponds to the weight coefficient for the sample related to the respective sampling time is disconnected.

4. The method of claim 1, wherein when sampling is completed, the disconnected capacitors are reconnected in parallel, and a disconnected capacitor corresponding to a sample which is to be weighted with a negative sign is connected in parallel with a reversed polarity.

5. The method of claim 1, wherein when sampling is completed, groups of the disconnected capacitors are separately reconnected, thereby generating a respective combined signal for each group.

6. The method of claim 5, wherein the capacitors which are disconnected at the first sampling time and at every second sampling time thereafter are a first group of capacitors, and the capacitors which are disconnected at the second sampling time and at every second sampling time thereafter are a second group of capacitors.

7. The method of claim 6, wherein the period between two successive sampling times corresponds to substantially one quarter of a period of the electrical signal.

8. The method of claim 1, wherein when sampling is completed, the disconnected capacitors corresponding to samples that are to be weighted together with a positive sign are reconnected together in parallel, and the disconnected capacitors corresponding to samples that are to be weighted together with a negative sign are reconnected together in parallel.

9. An apparatus for sampling an electrical signal and generating a combined signal from at least two samples of the electrical signal, comprising:

a plurality of capacitors, and means, connected to the capacitors, for switchably connecting the capacitors, wherein, at a first stage, the switching means connects the capacitors in parallel to the electrical signal;

at a second stage, the switching means disconnects, at each of a plurality of sampling times, a respective one of the plurality of capacitors from the electrical signal, thereby forming the samples; and at a third stage, after the sampling times, the switching means reconnects the disconnected capacitors together to form the combined signal in dependence on the charges of the capacitors when they were disconnected from the electrical signal and on the capacitances of the capacitors.

10. The apparatus of claim 9, wherein the capacitances of the capacitors relate to each other as weight coefficients for samples of electrical signal.

11. The apparatus of claim 10, wherein during the second stage, the switching means disconnects, at each sampling time, the capacitor having a capacitance which corresponds to the weight coefficient for the sample related to the respective sampling time.

12. The apparatus of claim 10, wherein during the third stage, the switching means reconnects the disconnected capacitors in parallel, and a disconnected capacitor corresponding to a sample which is to be weighted with a negative sign is reconnected in parallel with a reversed polarity.

13. The apparatus of claim 9, wherein the switching means reconnects separate groups of the capacitors to form a respective combined signal for each group.

14. The apparatus of claim 13, wherein the capacitors which are disconnected at the first sampling time and at every second sampling time thereafter are a first group of capacitors, and the capacitors which are disconnected at the second sampling time and at every second sampling time thereafter are a second group of capacitors.

15. The apparatus of claim 14, wherein a period between two successive sampling times corresponds to substantially one quarter of a period of the electrical signal.

16. The apparatus of claim 9, wherein during the third stage, the switching means reconnects together in parallel the disconnected capacitors corresponding to samples that are to be weighted together with a positive sign, and the switching means reconnects together in parallel the disconnected capacitors corresponding to samples that are to be weighted together with a negative sign.

* * * * *